(12) United States Patent
Lee

(10) Patent No.: US 8,907,383 B2
(45) Date of Patent: Dec. 9, 2014

(54) STACK PACKAGES HAVING TOKEN RING LOOPS

(71) Applicant: SK Hynix Inc., Icheon-si, Gyeonggi-do (KR)

(72) Inventor: Ki Yong Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/845,382

(22) Filed: Mar. 18, 2013

(65) Prior Publication Data
US 2014/0175660 A1 Jun. 26, 2014

(30) Foreign Application Priority Data
Dec. 20, 2012 (KR) .......... 10-2012-0150085

(51) Int. Cl.
H01L 27/148 (2006.01)
H01L 21/44 (2006.01)

(52) U.S. Cl.
USPC .......................... 257/250; 438/652

(58) Field of Classification Search
USPC .......... 438/584–588, 109, 652; 257/250, 758, 257/E23.141–E23.179
See application file for complete search history.

(56) References Cited

U.S. PATENT DOCUMENTS

2002/0053727 A1* 5/2002 Kimura .................. 257/686
2013/0277831 A1* 10/2013 Yoon et al. ............. 257/737

FOREIGN PATENT DOCUMENTS

KR 1019970053214 A 7/1997
KR 1020090113679 A 11/2009
KR 1020110032711 A 3/2011

* cited by examiner

Primary Examiner — Calvin Lee
(74) Attorney, Agent, or Firm — William Park & Associates Patent Ltd.

(57) ABSTRACT

Stack packages are provided. The stack package includes a substrate having first and second bond fingers and a plurality of semiconductor chips stacked on the substrate. Each of the plurality of semiconductor chips has an input bonding pad and an output bonding pad. A first interconnection electrically connects the first bond finger to the input bonding pad of a lowermost semiconductor chip of the plurality of semiconductor chips. A second interconnection electrically connects the output bonding pad of a lower semiconductor chip of the plurality of semiconductor chips to the input bonding pad of an upper semiconductor chip stacked on the lower semiconductor chip. A third interconnection electrically connects the output bonding pad of an uppermost semiconductor chip of the plurality of semiconductor chips to the second bond finger.

9 Claims, 7 Drawing Sheets

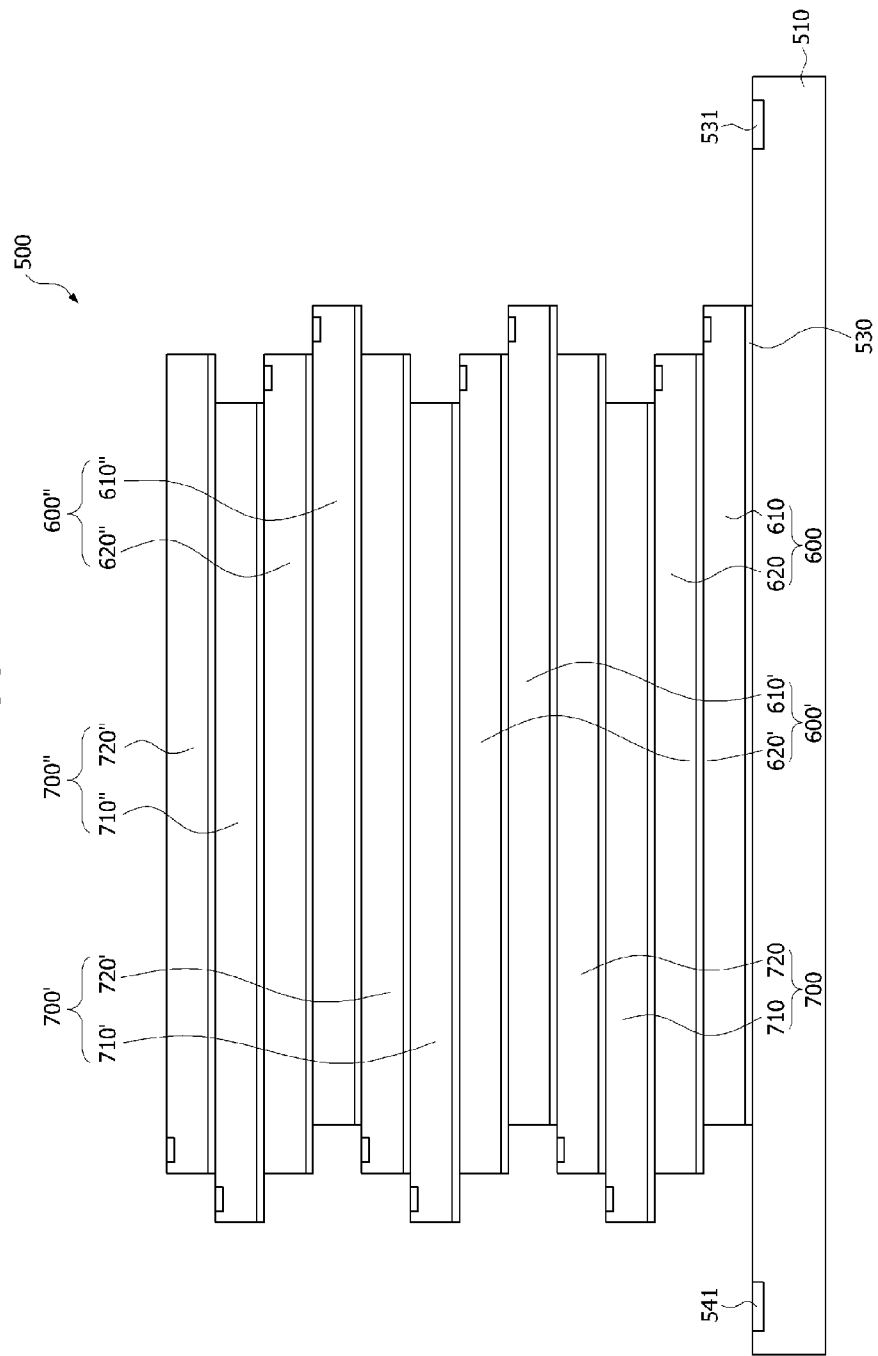

STACK PACKAGES HAVING TOKEN RING LOOPS

CROSS-REFERENCE TO RELATED APPLICATION

The present application claims priority under 35 U.S.C 119(a) to Korean Application No. 10-2012-0150085, filed on Dec. 20, 2012, in the Korean intellectual property Office, which is incorporated herein by reference in its entirety as set forth in full.

BACKGROUND

Embodiments of the present disclosure relate to semiconductor stack packages and, more particularly, to stack packages having token ring loops.

In the electronics industry, high reliable electronic devices fabricated at a low cost are increasingly in demand with the development of lighter, smaller, faster, multi-functional, and higher performance electronic systems. In response to such a demand, packaging techniques have been continuously improved or developed. The packaging techniques are used to protect semiconductor chips manufactured using a silicon wafer from an external environment and to electrically connect the semiconductor chips to other semiconductor chips or package substrates. Recently, stack packages have been widely used in the electronics industry. The stack packages may be fabricated by vertically stacking a plurality of semiconductor chips on a package substrate.

In the stack packages, the stacked chips may be electrically connected to the package substrate through bonding wires. The bonding wires may be bonded to bonding pads of the semiconductor chips. Thus, the semiconductor chips of the stack package should be vertically stacked to expose the bonding pads. That is, the semiconductor chips may be stacked to have a step structure. In such a case, a series of wire bonding processes may be performed between bond fingers of the substrate and the bonding pads of the stacked semiconductor chips to electrically connect the stacked semiconductor chips to the substrate. However, in such a case, electrical signals are simultaneously transmitted through the bonding wires, and all the stacked semiconductor chips may suffer from maximum currents. Accordingly, the power consumption of the stack package may be increased.

SUMMARY

Various embodiments are directed to stack packages having token ring loops.

According to some embodiments, a stack package includes a substrate having first and second bond fingers and a plurality of semiconductor chips stacked on the substrate. Each of the plurality of semiconductor chips has an input bonding pad and an output bonding pad. A first interconnection electrically connects the first bond finger to the input bonding pad of a lowermost semiconductor chip of the plurality of semiconductor chips. A second interconnection electrically connects the output bonding pad of a lower semiconductor chip of the plurality of semiconductor chips to the input bonding pad of an upper semiconductor chip stacked on the lower semiconductor chip. A third interconnection electrically connects the output bonding pad of an uppermost semiconductor chip of the plurality of semiconductor chips to the second bond finger.

According to further embodiments, a stack package includes a substrate having first and second bond fingers and a plurality of semiconductor chips stacked on the substrate. Each of the plurality of semiconductor chips has an input bonding pad, an output bonding pad, and a dummy pad. A first interconnection electrically connects the first bond finger to the input bonding pad of a lowermost semiconductor chip of the plurality of semiconductor chips. A second interconnection electrically connects the output bonding pad of a lower semiconductor chip of the plurality of semiconductor chips to the input bonding pad of an upper semiconductor chip stacked on the lower semiconductor chip. A third interconnection electrically connects the output bonding pad of an upper semiconductor chip of the plurality of semiconductor chips to the dummy pad of a lower semiconductor chip under the upper semiconductor chip. A fourth interconnection electrically connects the dummy pad of a lowermost semiconductor chip of the plurality of semiconductor chips to the second bond finger.

According to further embodiments, a stack package includes a substrate and a first semiconductor chip group having a plurality of first semiconductor chips stacked on the substrate. The substrate has a first bond finger, a second bond finger, and a third bond finger. Each of the first semiconductor chips has an input bonding pad, an output bonding pad, and a dummy pad. A second semiconductor chip group including a plurality second semiconductor chips is stacked on the first semiconductor chip group. Each of the second semiconductor chips has an input bonding pad, an output bonding pad, and a dummy pad. A first token ring loop includes a first interconnection, a second interconnection, a third interconnection, and a fourth interconnection. The first interconnection of the first token ring loop electrically connects the first bond finger of the substrate to the input bonding pad of a lowermost first semiconductor chip of the first semiconductor chips. The second interconnection of the first token ring loop electrically connects the output bonding pad of a lower first semiconductor chip of the first semiconductor chips to the input bonding pad of an upper first semiconductor chip stacked on the lower first semiconductor chip. The third interconnection of the first token ring loop electrically connects the output bonding pad of an upper first semiconductor chip of the first semiconductor chips to the dummy pad of a lower first semiconductor chip under the upper first semiconductor chip. The fourth interconnection of the first token ring loop electrically connects the dummy pad of a lowermost first semiconductor chip of the first semiconductor chips to the second bond finger of the substrate. A second token ring loop includes a first interconnection, a second interconnection, a third interconnection, and a fourth interconnection. The first interconnection of the second token ring loop electrically connects the second bond finger of the substrate to the input bonding pad of a lowermost second semiconductor chip of the second semiconductor chips. The second interconnection of the second token ring loop electrically connects the output bonding pad of a lower second semiconductor chip of the second semiconductor chips to the input bonding pad of an upper second semiconductor chip stacked on the lower second semiconductor chip. The third interconnection of the second token ring loop electrically connects the output bonding pad of an upper second semiconductor chip of the second semiconductor chips to the dummy pad of a lower second semiconductor chip under the upper second semiconductor chip. The fourth interconnection of the second token ring loop electrically connects the dummy pad of a lowermost second semiconductor chip of the second semiconductor chips to the third bond finger of the substrate.

According to further embodiments, a stack package includes a substrate having a first bond finger group and a second bond finger group. Each of the first and second bond finger groups includes a first bond finger, a second bond finger, and a third bond finger. First semiconductor chip groups and second semiconductor chip groups are alternately and repeatedly stacked on the substrate. Each of the first semiconductor chip groups includes first semiconductor chips which are stacked, and each of the second semiconductor chip groups includes second semiconductor chips which are stacked. Each of the first and second semiconductor chips has an input bonding pad, an output bonding pad, and a dummy pad. A first group of first token ring loop includes: a first interconnection to electrically connect the first bond finger of the first bond finger group to the input bonding pad of a lowermost first semiconductor chip in a lower group of the first semiconductor chip groups; a second interconnection to electrically connect the output bonding pad of the lowermost first semiconductor chip in the lower group of the first semiconductor chip groups to the input bonding pad of an upper first semiconductor chip on the lowermost first semiconductor chip; a third interconnection to electrically connect the output bonding pad of the upper first semiconductor chip to the dummy pad of a lower first semiconductor chip under the upper first semiconductor chip; and a fourth interconnection to electrically connect the dummy pad of the lowermost first semiconductor chip to the second bond finger of the first bond finger group. A first group of second token ring loop includes: a first interconnection to electrically connect the second bond finger of the first bond finger group to the input bonding pad of a lowermost first semiconductor chip in an upper group of the first semiconductor chip groups; a second interconnection to electrically connect the output bonding pad of the lowermost first semiconductor chip in the upper group of the first semiconductor chip groups to the input bonding pad of an upper first semiconductor chip on the lowermost first semiconductor chip; a third interconnection to electrically connect the output bonding pad of the upper first semiconductor chip to the dummy pad of a lower first semiconductor chip under the upper first semiconductor chip; and a fourth interconnection to electrically connect the dummy pad of the lowermost first semiconductor chip to the third bond finger of the first bond finger group. A second group of first token ring loop includes: a first interconnection to electrically connect the first bond finger of the second bond finger group to the input bonding pad of a lowermost second semiconductor chip in a lower group of the second semiconductor chip groups; a second interconnection to electrically connect the output bonding pad of the lowermost second semiconductor chip in the lower group of the second semiconductor chip groups to the input bonding pad of an upper second semiconductor chip on the lowermost second semiconductor chip; a third interconnection to electrically connect the output bonding pad of the upper second semiconductor chip to the dummy pad of a lower second semiconductor chip under the upper second semiconductor chip; and a fourth interconnection to electrically connect the dummy pad of the lowermost second semiconductor chip to the second bond finger of the second bond finger group. A second group of second token ring loop includes a first interconnection for electrically connecting the second bond finger of the second bond finger group to the input bonding pad of a lowermost second semiconductor chip in an upper group of the second semiconductor chip groups, a second interconnection for electrically connecting the output bonding pad of the lowermost second semiconductor chip in the upper group of the second semiconductor chip groups to the input bonding pad of an upper second semiconductor chip on the lowermost second semiconductor chip, a third interconnection for electrically connecting the output bonding pad of the upper second semiconductor chip to the dummy pad of a lower second semiconductor chip under the upper second semiconductor chip, and a fourth interconnection for electrically connecting the dummy pad of the lowermost second semiconductor chip to the third bond finger of the second bond finger group.

BRIEF DESCRIPTION OF THE DRAWINGS

Embodiments of the inventive concept will become more apparent in view of the attached drawings and accompanying detailed description, in which:

FIG. 5 is a cross sectional view illustrating a stack package according to still another embodiments.

DETAILED DESCRIPTION OF THE EMBODIMENTS

Figure 1:
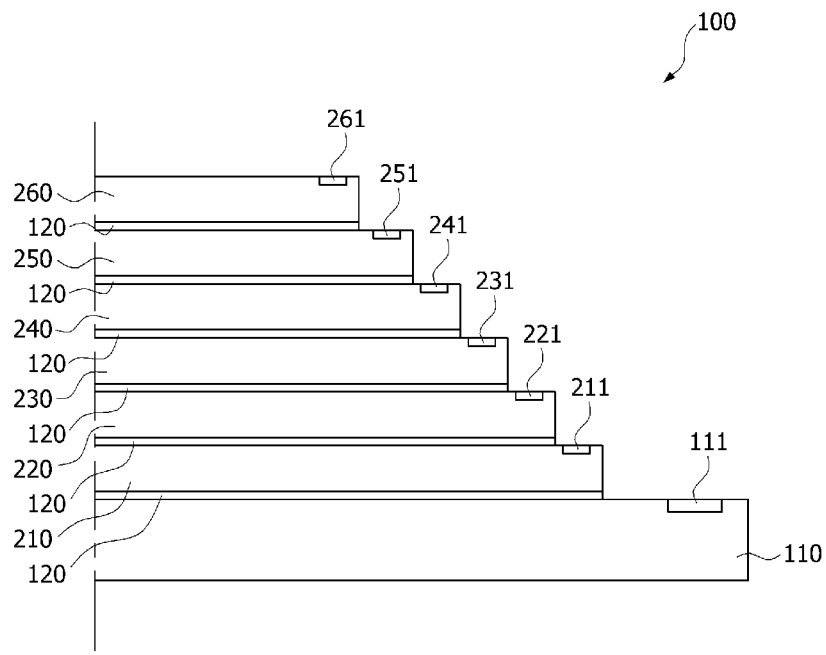
FIG. 1 is a cross sectional view illustrating a stack package according to an embodiments.
Figure 2:
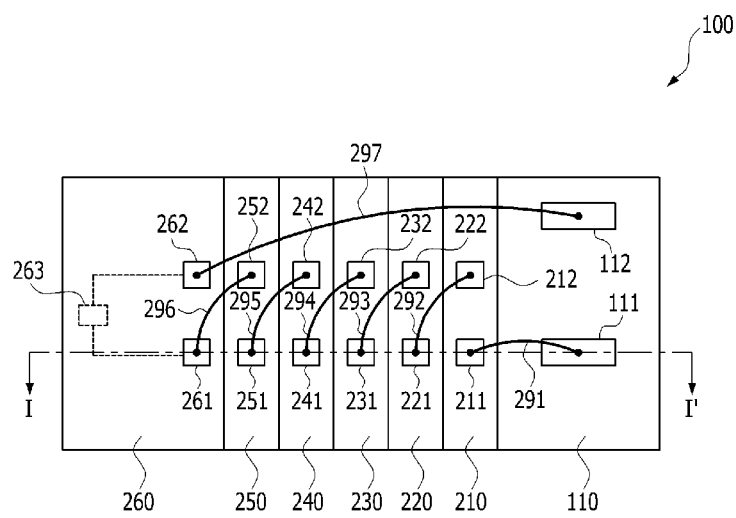
FIG. 2 is a plan view illustrating a token ring connection structure of the stack package shown in FIG. 1.

FIG. 1 is a cross sectional view illustrating a stack package according to an embodiments, and FIG. 2 is a plan view illustrating a token ring connection structure of the stack package shown in FIG. 1. FIG. 1 is a cross sectional view taken along a line I-I' of FIG. 2, and wire interconnections of FIG. 2 are not illustrated in FIG. 1 for the purpose of ease and convenience in explanation. Referring to FIGS. 1 and 2, a stack package 100 may be configured to include a substrate 110 and a plurality of semiconductor chips 210, 220, 230, 240, 250, and 260 sequentially stacked on the substrate 110. An insulating adhesive 120 may be disposed between the substrate 110 and the semiconductor chips 210, 220, 230, 240, 250, and 260. The substrate 110 may include a first bond finger 111 and a second bond finger 112. In some embodiments, the first bond finger 111 may be a terminal receiving signals outputted from an external device, and the second bond finger 112 may be a terminal outputting signals generated in the stack package 100 to the external device. That is, the first bond finger 111 may act as an input terminal of the stack package 100, and the second bond finger 112 may act as an output terminal of the stack package 100. Accordingly, the first and second bond fingers 111 and 112 may be electrically connected to an external device, for example, an external controller chip. The first and second bond fingers 111 and 112 may be disposed on a surface of the substrate 110 to be spaced apart from each other.

The plurality of semiconductor chips 210, 220, 230, 240, 250, and 260 may have the same structure. However, in some embodiments, the plurality of semiconductor chips 210, 220, 230, 240, 250, and 260 may have different structures and functions from each other. In any case, each of the semiconductor chips 210, 220, 230, 240, 250, and 260 may have an input bonding pad and an output bonding pad. For example, the semiconductor chip 210 may have an input bonding pad 211 and an output bonding pad 212. The semiconductor chip 220 may have an input bonding pad 221 and an output bonding pad 222. The semiconductor chip 230 may have an input bonding pad 231 and an output bonding pad 232. The semiconductor chip 240 may have an input bonding pad 241 and an output bonding pad 242. The semiconductor chip 250 may have an input bonding pad 251 and an output bonding pad 252, and the semiconductor chip 260 may have an input bonding pad 261 and an output bonding pad 262. The input bonding pads 211, 221, 231, 241, 251, and 261 and the output bonding pads 212, 222, 232, 242, 252, and 262 may be disposed on top surfaces of the semiconductor chips 210, 220, 230, 240, 250, and 260 and may be spaced apart from each other.

The semiconductor chips 210, 220, 230, 240, 250, and 260 may be stacked on the substrate 110 to have a step structure. This step structure may be to expose the first and second bond fingers 111 and 112, the input bonding pads 211, 221, 231, 241, 251, and 261, and the output bonding pads 212, 222, 232, 242, 252, and 262. The input/output bonding pad 261 and 262 of semiconductor chip 260 may be electrically connected to each other through an internal circuit 263 integrated in the semiconductor chip 260. For example, the input bonding pad 261 and the output bonding pad 262 of the semiconductor chip 260 may be electrically connected to an input terminal and an output terminal of the internal circuit 263 formed in the semiconductor chip 260, respectively. Each of the semiconductor chips 220, 230, 240, 250, and 260 may also have the same or similar configuration as the semiconductor chip 260. In some embodiments, each of the internal circuits may correspond to a signal delay circuit.

A token ring connection structure may be disposed between the first bond finger 111 of the substrate 110, the input bonding pads 211, 221, 231, 241, 251, and 261 and the output bonding pads 212, 222, 232, 242, 252, and 262 of the semiconductor chips 210, 220, 230, 240, 250, and 260, and the second bond finger 112 of the substrate 110. The token ring connection structure may include metal wires 291, 292, 293, 294, 295, 296, and 297. Specifically, the first bond finger 111 of the substrate 110 may be electrically connected to the input bonding pad 211 of the semiconductor chip 210 corresponding to a lowermost semiconductor chip among the semiconductor chips 210, 220, 230, 240, 250 and 260 through a first interconnection, for example, a first metal wire 291.

The output bonding pad 212 of the semiconductor chip 210 may be electrically connected to the input bonding pad 221 of the semiconductor chip 220 stacked on the semiconductor chip 210 through a second interconnection, for example, a second metal wire 292. This interconnection scheme to connect the output bonding pad of a lower semiconductor chip to the input bonding pad of an upper semiconductor chip through the second metal wire may be repeatedly applied to all of the semiconductor chips between the lowermost semiconductor chip 210 and the uppermost semiconductor chip 260. That is, the output bonding pad 222 of the semiconductor chip 220 may be electrically connected to the input bonding pad 231 of the semiconductor chip 230 stacked on the semiconductor chip 220 through a second metal wire 293. The output bonding pad 232 of the semiconductor chip 230 may be electrically connected to the input bonding pad 241 of the semiconductor chip 240 stacked on the semiconductor chip 230 through a second metal wire 294. The output bonding pad 242 of the semiconductor chip 240 may be electrically connected to the input bonding pad 251 of the semiconductor chip 250 stacked on the semiconductor chip 240 through a second metal wire 295. The output bonding pad 252 of the semiconductor chip 250 may be electrically connected to the input bonding pad 261 of the semiconductor chip 260 stacked on the semiconductor chip 250 through a second metal wire 296.

Further, the output bonding pad 262 of the semiconductor chip 260 may be electrically connected to the second bond finger 112 of the substrate 110 through a third interconnection, for example, a third metal wire 297. As a result, the first bond finger 111 (e.g., an input bond finger) may be connected to the second bond finger 112 (e.g., an output bond finger) through a signal transmission path having a token ring connection structure (or a token ring loop) that includes: the first metal wire 291, the input bonding pad 211 and the output bonding pad 212 of the semiconductor chip 210, the second metal wire 292, the input bonding pad 221 and the output bonding pad 222 of the semiconductor chip 220, the second metal wire 293, the input bonding pad 231 and the output bonding pad 232 of the semiconductor chip 230, the second metal wire 294, the input bonding pad 241 and the output bonding pad 242 of the semiconductor chip 240, the second metal wire 295, the input bonding pad 251 and the output bonding pad 252 of the semiconductor chip 250, the second metal wire 296, the input bonding pad 261 and the output bonding pad 262 of the semiconductor chip 260, and the third metal wire 297. That is, the semiconductor chips 210, 220, 230, 240, 250, and 260 may be serially connected to each other through the token ring connection structure. Thus, if the delay time of the internal circuit of each semiconductor chip 210, 220, 230, 240, 250, or 260 is appropriately controlled, the current flowing through the semiconductor chips 210, 220, 230, 240, 250, and 260 may be reduced to prevent the stack package 100 from suffering due to a maximum current. That is, the token ring structure may reduce the power consumption of the stack package 100.

Figure 3:
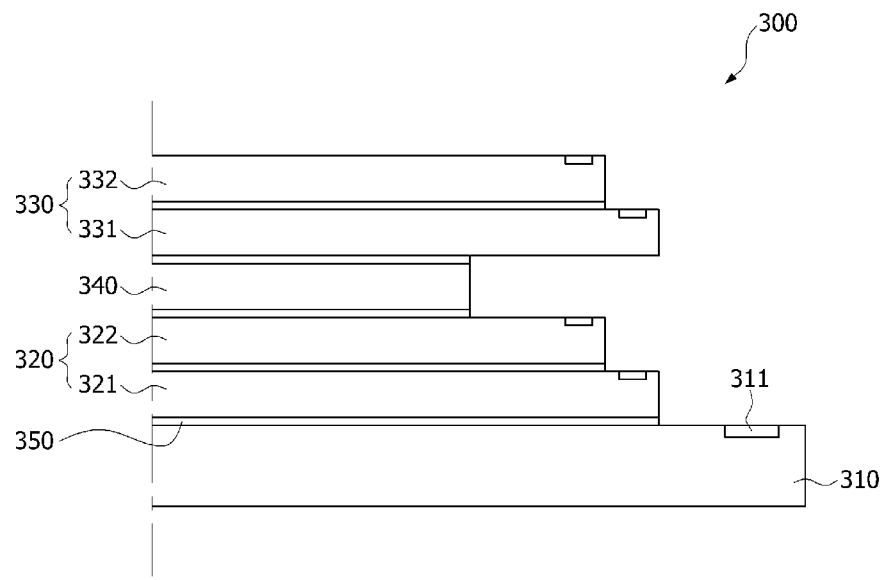
FIG. 3 is a cross sectional view illustrating a stack package according to another embodiments.
Figure 4A:
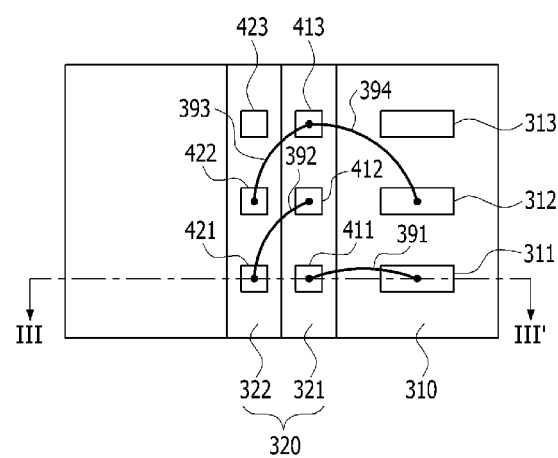
FIGS. 4A and 4B are plan views illustrating token ring connection structures of the stack package shown in FIG. 3.
Figure 4B:
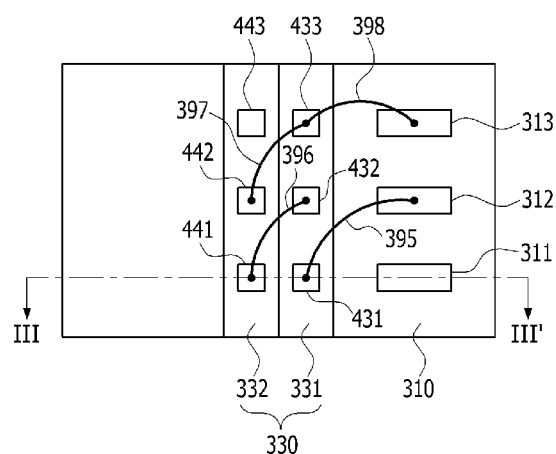

FIG. 3 is a cross sectional view illustrating a stack package according to another embodiments, and FIGS. 4A and 4B are plan views illustrating token ring connection structures of the stack package shown in FIG. 3. Further, FIG. 3 is a cross sectional view taken along a line III-III' of FIGS. 4A and 4B. For the purpose of ease and convenience in explanation, wire interconnections of FIGS. 4A and 4B are not illustrated in FIG. 3. Referring to FIGS. 3, 4A, and 4B, a stack package 300 according to the present embodiment may be configured to include a first semiconductor chip group 320 and a second semiconductor chip group 330 which are sequentially stacked on a substrate 300. An interposer 340 may be disposed between the first and second semiconductor chip groups 320 and 330. However, in some embodiments, the second semiconductor chip group 330 may be directly stacked on the first semiconductor chip group 320 without use of the interposer 340. The substrate 300 may have a first bond finger 311, a second bond finger 312, and a third bond finger 313 which are disposed to be adjacent to each other on a surface of a body of the substrate 300. In some embodiments, the first bond finger 311 may be a terminal receiving signals outputted from an external device, and the third bond finger 313 may be a terminal outputting signals generated in the stack package 300 to the external device. That is, the first bond finger 311 may act as an input terminal of the stack package 300, and the third bond finger 313 may act as an output terminal of the stack package 300. Accordingly, the first and third bond fingers 311 and 313 may be electrically connected to an external device, for example, an external controller chip. The second bond finger 312 disposed between the first and third bond fingers 311 and 313 may act as a signal transmission terminal between the first semiconductor chip group 320 and the second semiconductor chip group 330. Thus, in some embodiments, the number of the second bond finger 312 may be two or more. That is, the number of the second bond finger 312 may be determined according to the number of the semiconductor chip groups.

The first semiconductor chip group 320 may include first semiconductor chips 321 and 322 which are sequentially stacked on the substrate 310 with an adhesive 350 interposed therebetween. Although the present embodiment is described in conjunction with an example that the number of first semiconductor chips 321 and 322 is two, the inventive concept is not limited thereto. For example, the first semiconductor chip group 320 may include three or more first semiconductor chips. Each of the first semiconductor chips 321 and 322 may have an input bonding pad 411 or 421, an output bonding pad 412 or 422, and a dummy pad 413 or 423 which are disposed to be spaced apart from each other on a surface thereof. The first semiconductor chips 321 and 322 may be stacked to have a step structure. Thus, the input bonding pads 411 and 421, the output bonding pads 412 and 422, and the dummy pads 413 and 423, which are disposed on edges of the first semiconductor chips 321 and 322, may be exposed.

The second semiconductor chip group 330 may be disposed on the interposer 340. However, in the event that the interposer 340 is absent, the second semiconductor chip group 330 is directly disposed on a surface of the first semiconductor chip group 320 opposite to the substrate 300. The second semiconductor chip group 330 may include second semiconductor chips 331 and 332 which are sequentially stacked with the adhesive 350 interposed therebetween. Although the present embodiment is described in conjunction with an example that the number of second semiconductor chips 331 and 332 is two, the inventive concept is not limited thereto. For example, the second semiconductor chip group 330 may include three or more second semiconductor chips. Each of the second semiconductor chips 331 and 332 may have an input bonding pad 431 or 441, an output bonding pad 432 or 442, and a dummy pad 433 or 443 which are disposed to be spaced apart from each other on a surface thereof. The second semiconductor chips 331 and 332 may have the same function and configuration as the first semiconductor chips 321 and 322. Further, the second semiconductor chips 331 and 332 may be stacked to have the same structure (e.g., a step structure) as the first semiconductor chips 321 and 322. Thus, the input bonding pads 431 and 441, the output bonding pads 432 and 442, and the dummy pads 433 and 443, which are disposed on edges of the second semiconductor chips 331 and 332, may be exposed.

Although the first and second semiconductor chip groups 320 and 330 are distinguished form each other in the present embodiment, the embodiments are not limited thereto. For example, the first semiconductor chip group 320 may be the same semiconductor chip group as the second semiconductor chip group 330, and the first and second semiconductor chip groups 320 and 330 may be merely distinguished form each other according to vertical stack positions thereof. Thus, the first semiconductor chips 321 and 322 constituting the first semiconductor chip group 320 may be substantially the same configuration as the second semiconductor chips 331 and 332 constituting the second semiconductor chip group 330.

According to the present embodiment, the second semiconductor chip group 330 may be vertically aligned with the first semiconductor chip group 320. That is, the lowermost first semiconductor chip 321 of the first semiconductor chip group 320 and the lowermost second semiconductor chip 331 of the second semiconductor chip group 330 may be vertically aligned with each other. A sidewall of the lowermost first semiconductor chip 321 and a sidewall of the lowermost second semiconductor chip 331 may be located on a single vertical line. Similarly, the uppermost first semiconductor chip 322 of the first semiconductor chip group 320 and the uppermost second semiconductor chip 332 of the second semiconductor chip group 330 may be vertically aligned with each other. A sidewall of the uppermost first semiconductor chip 322 and a sidewall of the uppermost second semiconductor chip 332 may be located on a single vertical line. Thus, the stack package 300 may employ other token ring connection structures having different configuration from the token ring connection structure of the previous embodiment illustrated in FIGS. 1 and 2.

Specifically, as illustrated in FIG. 4A, the input bonding pad 411 of the first semiconductor chip 321 corresponding to a lowermost semiconductor chip of the first semiconductor chip group 320 may be electrically connected to the first bond finger 311 of the substrate 310 through a first interconnection, for example, a first metal wire 391. The output bonding pad 412 of the lowermost first semiconductor chip 321 may be electrically connected to the input bonding pad 421 of the first semiconductor chip 322 disposed on the first semiconductor chip 321 through a second interconnection, for example, a second metal wire 392. If the first semiconductor chip group 320 includes three or more first semiconductor chips which are sequentially stacked, the interconnection scheme to connect the output bonding pad 412 of the first semiconductor chip 321 to the input bonding pad 421 of the first semiconductor chip 322 through the second metal wire 392 may be repeatedly applied to all the first semiconductor chips between the lowermost first semiconductor chip and the uppermost first semiconductor chip. The output bonding pad 422 of the first semiconductor chip 322 corresponding to an uppermost semiconductor chip of the first semiconductor chip group 320 may be electrically connected to the dummy pad 413 of the first semiconductor chip 321 under the first semiconductor chip 322 through a third interconnection, for example, a third metal wire 393. If the first semiconductor chip group 320 includes three or more first semiconductor chips which are sequentially stacked, the interconnection scheme to connect the output bonding pad 422 of the first semiconductor chip 322 to the dummy pad 413 of the first semiconductor chip 321 through the third metal wire 393 may be repeatedly applied to all the first semiconductor chips between the lowermost first semiconductor chip and the uppermost first semiconductor chip. The dummy pad 413 of the lowermost first semiconductor chip 321 may be electrically connected to the second bond finger 312 of the substrate 310 through a fourth interconnection, for example, a fourth metal wire 394.

In some embodiments, if the first semiconductor chip group 320 includes three or more first semiconductor chips which are sequentially stacked, the output bonding pad of the uppermost first semiconductor chip may be electrically connected to a dummy pad of one of the first semiconductor chips under the uppermost first semiconductor chip through the third metal wire 393. The dummy pad may be electrically connected to the second bond finger 312 of the substrate 310 through the fourth metal wire 394. Alternatively, if the first semiconductor chip group 320 includes three or more first semiconductor chips which are sequentially stacked, the output bonding pad of the uppermost first semiconductor chip may be electrically connected to a dummy pad of one of the first semiconductor chips under the uppermost first semiconductor chip through the third metal wire 393. The dummy pad may be electrically connected to the second bond finger 312 of the substrate 310 via a dummy pad of another first semiconductor chip.

As described above, the first bond finger 311 of the substrate 310 may be connected to the second bond finger 312 through a first token ring loop including the first metal wire 391 the input bonding pad 411 and the output bonding pad 412 of the first semiconductor chip 321. The first token ring loop may also include the second metal wire 392, the input bonding pad 421 and the output bonding pad 422 of the first semiconductor chip 322. In addition, the first token ring loop may also include the third metal wire 393, the dummy pad 413 of the first semiconductor chip 321, and the fourth metal wire 394.

Subsequently, as illustrated in FIG. 4B, the input bonding pad 431 of the second semiconductor chip 331 corresponding to a lowermost semiconductor chip of the second semiconductor chip group 330 may be electrically connected to the second bond finger 312 of the substrate 310 through a first interconnection, for example, a first metal wire 395. The second bond finger 312 may correspond to a bond finger which is connected to the dummy pad 413 of the lowermost first semiconductor chip 321 of the first semiconductor chip group 320. The output bonding pad 432 of the second semiconductor chip 331 may be electrically connected to the input bonding pad 441 of the second semiconductor chip 332 disposed on the second semiconductor chip 331 through a second interconnection, for example, a second metal wire 396. If the second semiconductor chip group 330 includes three or more second semiconductor chips which are sequentially stacked, the interconnection scheme for connecting the output bonding pad 432 of the lower second semiconductor chip 331 to the input bonding pad 441 of the upper second semiconductor chip 332 through the second metal wire 396 may be repeatedly applied. The interconnection scheme may be applied to all the second semiconductor chips between the lowermost second semiconductor chip and the uppermost second semiconductor chip. The output bonding pad 442 of the second semiconductor chip 332 corresponding to an uppermost semiconductor chip of the second semiconductor chip group 330 may be electrically connected to the dummy pad 433 of the second semiconductor chip 331 under the second semiconductor chip 332 through a third interconnection, for example, a third metal wire 397.

If the second semiconductor chip group 330 includes three or more second semiconductor chips which are sequentially stacked, the interconnection scheme to connect the output bonding pad 442 of the upper second semiconductor chip 332 to the dummy pad 433 of the lower second semiconductor chip 331 through the third metal wire 397 may be repeatedly applied. The interconnection scheme may be applied to all of the second semiconductor chips between the lowermost second semiconductor chip and the uppermost second semiconductor chip. The dummy pad 433 of the lowermost second semiconductor chip 331 may be electrically connected to the third bond finger 313 of the substrate 310 through a fourth interconnection, for example, a fourth metal wire 398.

In some embodiments, if the second semiconductor chip group 330 includes three or more second semiconductor chips which are sequentially stacked, the output bonding pad of the uppermost second semiconductor chip may be electrically connected to a dummy pad. The dummy pad may be of one of the second semiconductor chips under the uppermost second semiconductor chip through the third metal wire 397. The dummy pad may then be electrically connected to the third bond finger 313 of the substrate 310 through the fourth metal wire 398. Alternatively, if the second semiconductor chip group 330 includes three or more second semiconductor chips which are sequentially stacked, the output bonding pad of the uppermost second semiconductor chip may be electrically connected. The connection may be to a dummy pad of one of the second semiconductor chips under the uppermost first semiconductor chip through the third metal wire 397 The dummy pad may then be electrically connected to the third bond finger 313 of the substrate 310 via a dummy pad of another second semiconductor chip.

As described above, the second bond finger 312 of the substrate 310 may be connected to the third bond finger 313 through a second token ring loop including the first metal wire 395, the input bonding pad 431 and the output bonding pad 432 of the second semiconductor chip 331. The second token ring loop may include the second metal wire 396, the input bonding pad 441 and the output bonding pad 442 of the second semiconductor chip 332. The second token ring loop may also include the third metal wire 397, the dummy pad 433 of the second semiconductor chip 331, and the fourth metal wire 398. The second token ring loop and the first token ring loop may constitute a total token ring loop of the stack package 300.

Figure 6A:
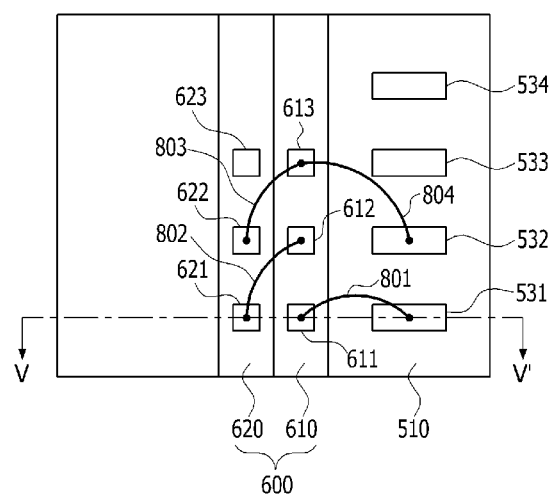
FIGS. 6A, 6B, 6C, 7A, 7B and 7C are plan views illustrating token ring connection structures of the stack package shown in FIG. 5.

FIG. 5 is a cross sectional view illustrating a stack package according to still another embodiments, and FIGS. 6A<6B, 6C, 7A, 7B and 7C are plan views illustrating token ring connection structures of the stack package shown in FIG. 5. FIG. 5 is a cross sectional view taken along a line V-V' of FIGS. 6A, 6B, 6C, 7A, 7B and 7C, and wire interconnections of FIGS. 6A, 6B, 6C, 7A, 7B and 7C are not illustrated in FIG. 5 for the purpose of ease and convenience in explanation.

Referring to FIG. 5, a package 500 according to the present embodiment may include first semiconductor chip groups 600, 600' and 600" and second semiconductor chip groups 700, 700' and 700" which are alternately and repeatedly stacked on a substrate 510. Although the present embodiment is described in conjunction with an example that two semiconductor chip groups are alternately and repeatedly stacked, the inventive concept is not limited thereto. That is, the present embodiment is equally applicable to any stack packages including three or more semiconductor chip groups which are alternately and repeatedly stacked. Further, although the present embodiment is described in conjunction with an example that each semiconductor chip group include three semiconductor chips, the inventive concept is not limited thereto. That is, the present embodiment is equally applicable to any stack packages that each semiconductor chip group includes four or more semiconductor chips.

The first semiconductor chip group 600 disposed at a lowermost level of the three first semiconductor chip groups 600, 600' and 600" may include a pair of first semiconductor chips 610 and 620 which are stacked in a first direction to have a step structure. The first semiconductor chip group 600' disposed at a middle level of the three first semiconductor chip groups 600, 600' and 600" may include a pair of first semiconductor chips 610' and 620' which are stacked in the first direction to have a step structure. The first semiconductor chip group 600" disposed at an uppermost level of the three first semiconductor chip groups 600, 600' and 600" may include a pair of first semiconductor chips 610" and 620" which are stacked in the first direction to have a step structure. The second semiconductor chip group 700 disposed at a lowermost level of the three second semiconductor chip groups 700, 700' and 700" may include a pair of second semiconductor chips 710 and 720 which are stacked in a second direction opposite to the first direction to have a step structure. The second semiconductor chip group 700' may be disposed at a middle level of the three second semiconductor chip groups 700, 700' and 700" that may include a pair of second semiconductor chips 710' and 720' which are stacked in the second direction to have a step structure. The second semiconductor chip group 700" disposed at an uppermost level of the three second semiconductor chip groups 700, 700' and 700" that may include a pair of second semiconductor chips 710" and 720" which are stacked in the first direction to have a step structure. As described above, the first direction may be a direction which is opposite to the second direction. However, in some embodiments, the first direction may be a different direction from the second direction, but not opposite to the second direction. Further, in some embodiments, the number of the semiconductor chips constituting each semiconductor chip group may be three or more. An adhesive 530 may be disposed between the substrate 510 and the lowermost semiconductor chip 610 as well as between the first and second semiconductor chips constituting the first and second semiconductor chip groups.

Figure 6B:
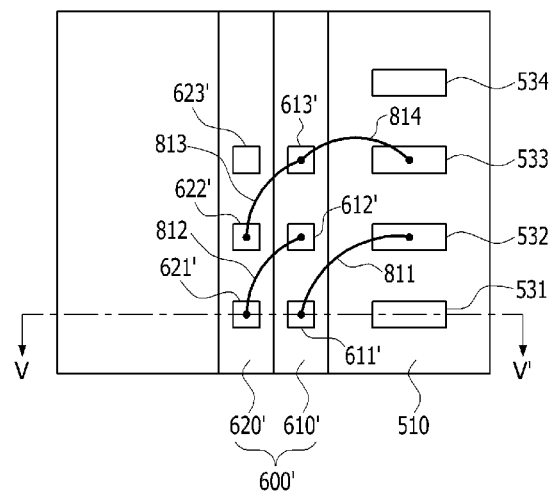
Figure 6C:
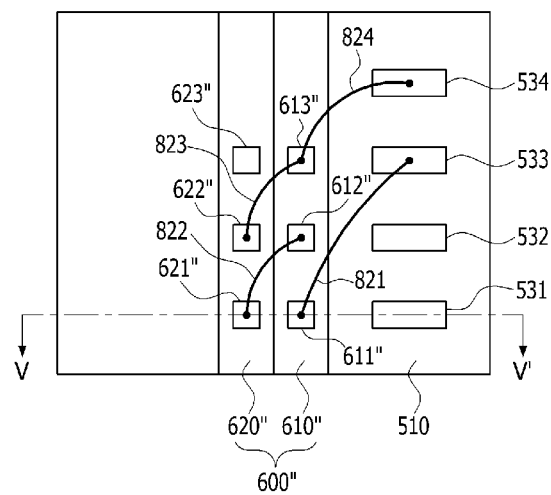
Figure 7A:
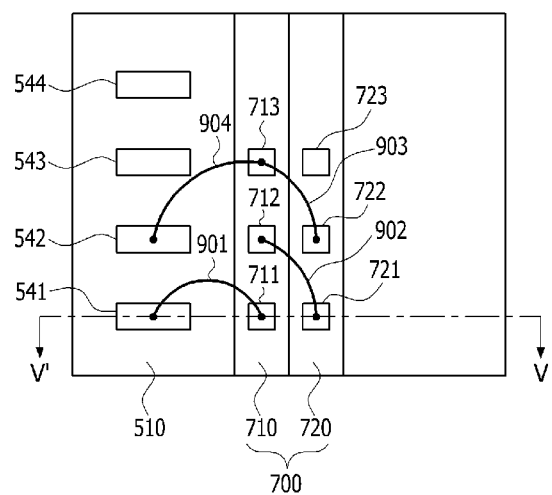
Figure 7B:
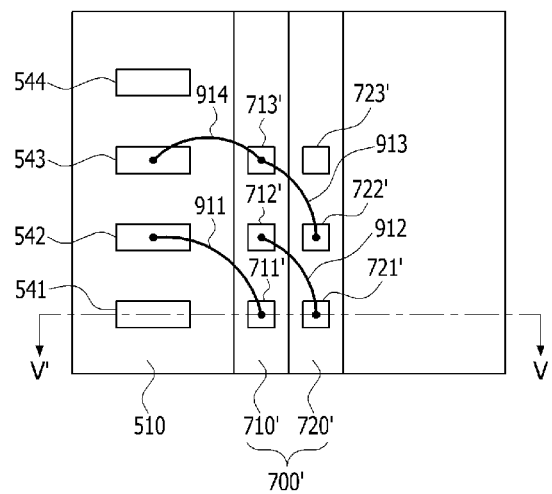
Figure 7C:
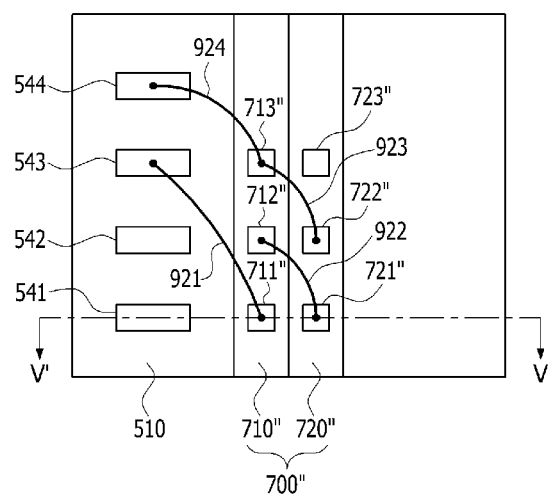

As illustrated in FIGS. 6A, 6B and 6C, a first bond finger group including first to fourth bond fingers 531, 532, 533 and 534 may be disposed on an edge of a first surface of the substrate 510 and may be spaced apart from each other. In addition, as illustrated in FIGS. 7A, 7B and 7C, a second bond finger group including first to fourth bond fingers 541, 542, 543 and 544 may be disposed on another edge of the first surface of the substrate 510 and may be spaced apart from each other. In some embodiments, the first bond finger 531 of the first bond finger group and the first bond finger 541 of the second bond finger group may act as input terminals receiving signals outputted from an external device. The third bond finger 533 of the first bond finger group and the third bond finger 543 of the second bond finger group may act as output terminals outputting signals generated in the stack package 500 to the external device. Accordingly, the first and third bond fingers 531 and 533 of the first bond finger group may be electrically connected to an external device. The external device may be for example, an external controller chip, and the first and third bond fingers 541 and 543 of the second bond finger group may also be electrically connected to the external controller chip. The second bond finger 532 disposed between the first and third bond fingers 531 and 533 of the first bond finger group may act as a signal transmission terminal between the first semiconductor chip groups 600 and 600'. Further, the third bond finger 533 disposed between the second and fourth bond fingers 532 and 534 of the first bond finger group may act as a signal transmission terminal between the first semiconductor chip groups 600' and 600". Thus, the number of the bond fingers between the first and fourth bond fingers 531 and 534 of the first bond finger group may be two or more. That is, the number of the bond fingers between the first and fourth bond fingers 531 and 534 of the first bond finger group may be determined according to the number of the first semiconductor chip groups 600, 600', and 600". Similarly, the second bond finger 542 disposed between the first and third bond fingers 541 and 543 of the second bond finger group may act as a signal transmission terminal between the second semiconductor chip groups 700 and 700'. Further, the third bond finger 543 disposed between the second and fourth bond fingers 542 and 544 of the second bond finger group may act as a signal transmission terminal between the second semiconductor chip groups 700' and 700". Thus, the number of the bond fingers between the first and fourth bond fingers 541 and 544 of the second bond finger group may be two or more. That is, the number of the bond fingers between the first and fourth bond fingers 541 and 544 of the second bond finger group may be determined according to the number of the second semiconductor chip groups 700, 700' and 700".

Each of the first semiconductor chips 610, 620, 610', 620', 610" and 620" constituting the first semiconductor chip groups 600, 600' and 600" may include an input bonding pad, an output bonding pad and a dummy pad. For example, the first semiconductor chips 610, 620, 610', 620', 610" and 620" may include input bonding pads 611, 621, 611', 621', 611" and 621", respectively. Further, the first semiconductor chips 610, 620, 610', 620', 610" and 620" may include output bonding pads 612, 622, 612', 622', 612" and 622", respectively. Moreover, the first semiconductor chips 610, 620, 610', 620', 610" and 620" may include dummy pads 613, 623, 613', 623', 613" and 623", respectively. The input bonding pads 611, 621, 611', 621', 611" and 621", the output bonding pads 612, 622, 612', 622', 612" and 622", and the dummy pads 613, 623, 613', 623', 613" and 623" may be exposed because the first semiconductor chips of each of the first semiconductor chip groups 600, 600' and 600" are stacked to have a step structure.

Similarly, each of the second semiconductor chips 710, 720, 710', 720', 710" and 720" constituting the second semiconductor chip groups 700, 700' and 700" may also include an input bonding pad, an output bonding pad, and a dummy pad. For example, the second semiconductor chips 710, 720, 710', 720', 710" and 720" may include input bonding pads 711, 721, 711', 721', 711" and 721", respectively. Further, the second semiconductor chips 710, 720, 710', 720', 710" and 720" may include output bonding pads 712, 722, 712', 722', 712" and 722", respectively. Moreover, the second semiconductor chips 710, 720, 710', 720', 710" and 720" may include dummy pads 713, 723, 713', 723', 713" and 723", respectively. The input bonding pads 711, 721, 711', 721', 711" and 721", the output bonding pads 712, 722, 712', 722', 712" and 722", and the dummy pads 713, 723, 713', 723', 713" and 723" may be exposed because the second semiconductor chips of each of the second semiconductor chip groups 700, 700' and 700" are stacked to have a step structure.

In the stack package 500, the first semiconductor chips 610, 620, 610', 620', 610" and 620" of the first semiconductor chip groups 600, 600' and 600" may be electrically connected to the first, second, third and fourth bond fingers 531, 532, 533 and 534 of the first bond finger group through a token ring connection structure.

Specifically, as illustrated in FIG. 6A, the input bonding pad 611 of the lower first semiconductor chip 610 of the first semiconductor chip group 600 disposed at a lowermost level of the three first semiconductor chip groups 600, 600' and 600" may be electrically connected. The connection may be to the first bond finger 531 of the substrate 510 through a first interconnection, for example, a first metal wire 801. The output bonding pad 612 of the lower first semiconductor chip 610 may be electrically connected to the input bonding pad 621 of the upper first semiconductor chip 620. The upper first semiconductor chip 620 may be disposed on the lower first semiconductor chip 610 through a second interconnection, for example, a second metal wire 802. If the first semiconductor chip group 600 includes three or more first semiconductor chips which are sequentially stacked, the interconnection scheme to connect the output bonding pad 612 of the lower first semiconductor chip 610 to the input bonding pad 621 of the upper first semiconductor chip 620 through the second metal wire 802 may be repeatedly applied. The interconnection scheme may be applied to all of the first semiconductor chips between the lowermost first semiconductor chip and the uppermost first semiconductor chip. The output bonding pad 622 of the first semiconductor chip 620 corresponding to an uppermost semiconductor chip of the first semiconductor chip group 600 may be electrically connected to the dummy pad 613 of the first semiconductor chip 610 under the first semiconductor chip 620 through a third interconnection, for example, a third metal wire 803. If the first semiconductor chip group 600 includes three or more first semiconductor chips which are sequentially stacked, the interconnection scheme to connect the output bonding pad 622 of the first semiconductor chip 620 to the dummy pad 613 of the first semiconductor chip 610 through the third metal wire 803 may be repeatedly applied. The interconnection scheme may be applied to all of the first semiconductor chips between the lowermost first semiconductor chip and the uppermost first semiconductor chip. The dummy pad 613 of the lowermost first semiconductor chip 610 may be electrically connected to the second bond finger 532 of the substrate 510 through a fourth interconnection. The fourth interconnection may be for example, a fourth metal wire 804.

In some embodiments, if the first semiconductor chip group 600 includes three or more first semiconductor chips which are sequentially stacked, the output bonding pad of the uppermost first semiconductor chip may be electrically connected to a dummy pad chip through the third metal wire 803. The dummy pad may be of one of the first semiconductor chips under the uppermost first semiconductor. The dummy pad may also be electrically connected to the second bond finger 532 of the substrate 510 through the fourth metal wire 804. Alternatively, if the first semiconductor chip group 600 includes three or more first semiconductor chips which are sequentially stacked, the output bonding pad of the uppermost first semiconductor chip may be electrically connected. The connection may be to a dummy pad of one of the first semiconductor chips under the uppermost first semiconductor chip through the third metal wire 803. The dummy pad may be electrically connected to the second bond finger 532 of the substrate 510 via a dummy pad of another first semiconductor chip.

As described above, the first bond finger 531 of the substrate 510 may be connected to the second bond finger 532 through a first token ring loop which includes the first metal wire 801. The first bond finger 531 may also be connected to the input bonding pad 611 and the output bonding pad 612 of the first semiconductor chip 610. In addition, the first bond finger 531 may be connected to the second metal wire 802, the input bonding pad 621 and the output bonding pad 622 of the first semiconductor chip 620. Further, the first bond finger 531 may be connected to the third metal wire 803, the dummy pad 613 of the first semiconductor chip 610, and the fourth metal wire 804.

Subsequently, as illustrated in FIG. 6B, the input bonding pad 611' of the lower first semiconductor chip 610' of the first semiconductor chip group 600' disposed at a middle level of the three first semiconductor chip groups 600, 600' and 600" may be electrically connected to the second bond finger 532 of the substrate 510 through a first interconnection. The first interconnection may be, for example, a first metal wire 811. The second bond finger 532 may correspond to a bond finger which is connected to the dummy pad 613 of the lowermost first semiconductor chip 610 of the first semiconductor chip group 600. The output bonding pad 612' of the lower first semiconductor chip 610' may be electrically connected to the input bonding pad 621' of the upper first semiconductor chip 620'. The upper first semiconductor chip 620' may be disposed on the lower first semiconductor chip 610' through a second interconnection, for example, a second metal wire 812. If the first semiconductor chip group 600' includes three or more first semiconductor chips which are sequentially stacked, the interconnection scheme to connect the output bonding pad 612' of the lower first semiconductor chip 610' to the input bonding pad 621' of the upper first semiconductor chip 620' through the second metal wire 812 may be repeatedly applied. The interconnection scheme may be applied to all of the first semiconductor chips between the lowermost first semiconductor chip and the uppermost first semiconductor chip. The output bonding pad 622' of the first semiconductor chip 620' corresponding to an uppermost semiconductor chip of the first semiconductor chip group 600' may be electrically connected to the dummy pad 613' of the first semiconductor chip 610'. The first semiconductor chip 610' may be under the first semiconductor chip 620' through a third interconnection, for example, a third metal wire 813. If the first semiconductor chip group 600' includes three or more first semiconductor chips which are sequentially stacked, the interconnection scheme to connect the output bonding pad 622' of the first semiconductor chip 620' to the dummy pad 613' of the first semiconductor chip 610' through the third metal wire 813 may be repeatedly applied. The interconnection scheme may be applied to all of the first semiconductor chips between the lowermost first semiconductor chip and the uppermost first semiconductor chip. The dummy pad 613' of the lowermost first semiconductor chip 610' may be electrically connected to the third bond finger 533 of the substrate 510 through a fourth interconnection, for example, a fourth metal wire 814.

In some embodiments, if the first semiconductor chip group 600' includes three or more first semiconductor chips which are sequentially stacked, the output bonding pad of the uppermost first semiconductor chip may be electrically connected to a dummy pad of one of the first semiconductor chips. The first semiconductor chips may be under the uppermost first semiconductor chip through the third metal wire 813. The dummy pad may be electrically connected to the third bond finger 533 of the substrate 510 through the fourth metal wire 814. Alternatively, if the first semiconductor chip group 600' includes three or more first semiconductor chips which are sequentially stacked, the output bonding pad of the uppermost first semiconductor chip may be electrically connected to a dummy pad of one of the first semiconductor chips. The first semiconductor chips may be under the uppermost first semiconductor chip through the third metal wire 813 and the dummy pad may be electrically connected to the third bond finger 533 of the substrate 510 via a dummy pad of another first semiconductor chip.

As described above, the second bond finger 532 of the substrate 510 may be connected to the third bond finger 533 through a second token ring loop which includes the first metal wire 811, the input bonding pad 611' and the output bonding pad 612' of the first semiconductor chip 610'. The second token ring loop may also include the second metal wire 812, the input bonding pad 621' and the output bonding pad 622' of the first semiconductor chip 620'. The second token ring loop may also include the third metal wire 813, the dummy pad 613' of the first semiconductor chip 610', and the fourth metal wire 814.

Moreover, as illustrated in FIG. 6C, the input bonding pad 611" of the lower first semiconductor chip 610" of the first semiconductor chip group 600" disposed at an uppermost level of the three first semiconductor chip groups 600, 600' and 600" may be electrically connected to the third bond finger 533 of the substrate 510 through a first interconnection. The first interconnection may be, for example, a first metal wire 821. The third bond finger 533 may correspond to a bond finger which is connected to the dummy pad 613' of the lowermost first semiconductor chip 610' of the first semiconductor chip group 600'. The output bonding pad 612" of the lower first semiconductor chip 610" may be electrically connected to the input bonding pad 621" of the upper first semiconductor chip 620". The upper first semiconductor chip 620" may be disposed on the lower first semiconductor chip 610" through a second interconnection, for example, a second metal wire 822. If the first semiconductor chip group 600" includes three or more first semiconductor chips which are sequentially stacked, the interconnection scheme to connect the output bonding pad 612" of the lower first semiconductor chip 610" to the input bonding pad 621" of the upper first semiconductor chip 620" through the second metal wire 822 may be repeatedly applied. The interconnection scheme may be applied to all of the first semiconductor chips between the lowermost first semiconductor chip and the uppermost first semiconductor chip. The output bonding pad 622" of the first semiconductor chip 620" corresponding to an uppermost semiconductor chip of the first semiconductor chip group 600" may be electrically connected to the dummy pad 613" of the first semiconductor chip 610" under the first semiconductor chip 620" through a third interconnection. The third interconnection may be, for example, a third metal wire 823. If the first semiconductor chip group 600" includes three or more first semiconductor chips which are sequentially stacked, the interconnection scheme to connect the output bonding pad 622" of the first semiconductor chip 620" to the dummy pad 613" of the first semiconductor chip 610" through the third metal wire 823 may be repeatedly applied. The interconnection scheme may be applied to all the first semiconductor chips between the lowermost first semiconductor chip and the uppermost first semiconductor chip. The dummy pad 613" of the lowermost first semiconductor chip 610" may be electrically connected to the fourth bond finger 534 of the substrate 510 through a fourth interconnection, for example, a fourth metal wire 824.

In some embodiments, if the first semiconductor chip group 600" includes three or more first semiconductor chips which are sequentially stacked, the output bonding pad of the uppermost first semiconductor chip may be electrically connected to a dummy pad of one of the first semiconductor chips. The first semiconductor chips may be under the uppermost first semiconductor chip through the third metal wire 823. The dummy pad may be electrically connected to the fourth bond finger 534 of the substrate 510 through the fourth metal wire 824. Alternatively, if the first semiconductor chip group 600" includes three or more first semiconductor chips which are sequentially stacked, the output bonding pad of the uppermost first semiconductor chip may be electrically connected to a dummy pad chip through the third metal wire 823. The dummy pad may be of one of the first semiconductor chips under the uppermost first semiconductor. The dummy pad may be electrically connected to the fourth bond finger 534 of the substrate 510 via a dummy pad of another first semiconductor chip.

As described above, the third bond finger 533 of the substrate 510 may be connected to the fourth bond finger 534 through a third token ring loop. The third token ring loop may include the first metal wire 821, the input bonding pad 611" and the output bonding pad 612" of the first semiconductor chip 610". The third token ring loop may include the second metal wire 822, the input bonding pad 621" and the output bonding pad 622" of the first semiconductor chip 620". Further, the third token ring loop may include the third metal wire 823, the dummy pad 613" of the first semiconductor chip 610", and the fourth metal wire 824.

A first token ring group may consist of the first token ring loop between the substrate 510 and the first semiconductor chip group 600. The first token ring group may also consist of the second token ring loop between the substrate 510 and the first semiconductor chip group 600'. In addition, the first token ring group may also consist of the third token ring loop between the substrate 510 and the first semiconductor chip group 600" The first token ring group may electrically connect the first semiconductor chip groups 600, 600', and 600" to each other.

The second semiconductor chips 710, 720, 710', 720', 710" and 720" of the second semiconductor chip groups 700, 700' and 700" may be electrically connected to the first, second, third and fourth bond fingers 541, 542, 543, and 544 of the second bond finger group through a token ring connection structure.

Specifically, as illustrated in FIG. 7A, the input bonding pad 711 of the lower second semiconductor chip 710 of the second semiconductor chip group 700 may be disposed at a lowermost level of the three second semiconductor chip groups 700, 700' and 700". The input bonding pad 711 may be electrically connected to the first bond finger 541 of the substrate 510 through a first interconnection, for example, a first metal wire 901. The output bonding pad 712 of the lower second semiconductor chip 710 may be electrically connected to the input bonding pad 721 of the upper second semiconductor chip 720. The upper second semiconductor chip 720 may be disposed on the lower second semiconductor chip 710 through a second interconnection. The second interconnection may be, for example, a second metal wire 902. If the second semiconductor chip group 700 includes three or more second semiconductor chips which are sequentially stacked, the interconnection scheme to connect the output bonding pad 712 of the lower second semiconductor chip 710 to the input bonding pad 721 of the upper second semiconductor chip 720 through the second metal wire 902 may be repeatedly applied. The interconnection scheme may be applied to all of the second semiconductor chips between the lowermost second semiconductor chip and the uppermost second semiconductor chip. The output bonding pad 722 of the second semiconductor chip 720 corresponding to an uppermost semiconductor chip of the second semiconductor chip group 700 may be electrically connected to the dummy pad 713 of the second semiconductor chip 710 under the second semiconductor chip 720 through a third interconnection, for example, a third metal wire 903. If the second semiconductor chip group 700 includes three or more second semiconductor chips which are sequentially stacked, the interconnection scheme to connect the output bonding pad 722 of the second semiconductor chip 720 to the dummy pad 713 of the second semiconductor chip 710 through the third metal wire 903 may be repeatedly applied. The interconnection scheme may be applied to all the first semiconductor chips between the lowermost second semiconductor chip and the uppermost second semiconductor chip. The dummy pad 713 of the lowermost second semiconductor chip 710 may be electrically connected to the second bond finger 542 of the substrate 510 through a fourth interconnection. The fourth interconnection may be, for example, a fourth metal wire 904.

In some embodiments, if the second semiconductor chip group 700 includes three or more second semiconductor chips which are sequentially stacked, the output bonding pad of the uppermost second semiconductor chip may be electrically connected to a dummy pad chip through the third metal wire 903. The dummy pad may be of one of the second semiconductor chips under the uppermost second semiconductor. The dummy pad may be electrically connected to the second bond finger 542 of the substrate 510 through the fourth metal wire 904. Alternatively, if the second semiconductor chip group 700 includes three or more second semiconductor chips which are sequentially stacked, the output bonding pad of the uppermost second semiconductor chip may be electrically connected to a dummy pad through the third metal wire 903. The dummy pad may be of one of the second semiconductor chips under the uppermost second semiconductor chip. The dummy pad may be electrically connected to the second bond finger 542 of the substrate 510 via a dummy pad of another second semiconductor chip.

As described above, the first bond finger 541 of the substrate 510 may be connected to the second bond finger 542 through a first token ring loop which includes the first metal wire 901. The first token ring loop may also include the input bonding pad 711 and the output bonding pad 712 of the second semiconductor chip 710, the second metal wire 902, the input bonding pad 721. In addition, the first token ring loop may include the output bonding pad 722 of the second semiconductor chip 720, the third metal wire 903, the dummy pad 713 of the second semiconductor chip 710, and the fourth metal wire 904.

Subsequently, as illustrated in FIG. 7B, the input bonding pad 711' of the lower second semiconductor chip 710' of the second semiconductor chip group 700' may be disposed at a middle level of the three second semiconductor chip groups 700, 700' and 700". The input bonding pad 711' may be electrically connected to the second bond finger 542 of the substrate 510 through a first interconnection, for example, a first metal wire 911. The second bond finger 542 may correspond to a bond finger which is connected to the dummy pad 713 of the lowermost second semiconductor chip 710 of the second semiconductor chip group 700. The output bonding pad 712' of the lower second semiconductor chip 710' may be electrically connected to the input bonding pad 721' of the upper second semiconductor chip 720'. The second semiconductor chip 720' may be disposed on the lower second semiconductor chip 710' through a second interconnection, for example, a second metal wire 912.

If the second semiconductor chip group 700' includes three or more second semiconductor chips which are sequentially stacked, the interconnection scheme to connect the output bonding pad 712' of the lower second semiconductor chip 710' to the input bonding pad 721' of the upper second semiconductor chip 720' through the second metal wire 912 may be repeatedly applied. The interconnection scheme may be applied to all of the second semiconductor chips between the lowermost second semiconductor chip and the uppermost second semiconductor chip. The output bonding pad 722' of the second semiconductor chip 720' corresponding to an uppermost semiconductor chip of the second semiconductor chip group 700' may be electrically connected to the dummy pad 713' of the second semiconductor chip 710' under the second semiconductor chip 720' through a third interconnection. The third interconnection may be, for example, a third metal wire 913. If the second semiconductor chip group 700' includes three or more second semiconductor chips which are sequentially stacked, the interconnection scheme to connect the output bonding pad 722' of the second semiconductor chip 720' to the dummy pad 713' of the second semiconductor chip 710' through the third metal wire 913 may be repeatedly applied. The interconnection scheme may be applied to all of the second semiconductor chips between the lowermost second semiconductor chip and the uppermost second semiconductor chip. The dummy pad 713' of the lowermost second semiconductor chip 710' may be electrically connected to the third bond finger 543 of the substrate 510 through a fourth interconnection, for example, a fourth metal wire 914.

In some embodiments, if the second semiconductor chip group 700' includes three or more second semiconductor chips which are sequentially stacked, the output bonding pad of the uppermost second semiconductor chip may be electrically connected to a dummy pad through the third metal wire 913. The dummy pad may be of one of the second semiconductor chips under the uppermost second semiconductor chip. The dummy pad may be electrically connected to the third bond finger 543 of the substrate 510 through the fourth metal wire 914. Alternatively, if the second semiconductor chip group 700' includes three or more second semiconductor chips which are sequentially stacked, the output bonding pad of the uppermost second semiconductor chip may be electrically connected to a dummy pad through the third metal wire 913. The dummy pad may be of one of the second semiconductor chips under the uppermost second semiconductor chip. The dummy pad may be electrically connected to the third bond finger 543 of the substrate 510 via a dummy pad of another second semiconductor chip.

As described above, the second bond finger 542 of the substrate 510 may be connected to the third bond finger 543 through a second token ring loop. The second token ring loop may include the first metal wire 911, the input bonding pad 711' and the output bonding pad 712' of the second semiconductor chip 710'. The second token ring loop may include the second metal wire 912, the input bonding pad 721' and the output bonding pad 722' of the second semiconductor chip 720'. The second token ring loop may include the third metal wire 913, the dummy pad 713' of the second semiconductor chip 710', and the fourth metal wire 914.

Moreover, as illustrated in FIG. 7C, the input bonding pad 711" of the lower second semiconductor chip 710" of the second semiconductor chip group 700" disposed at an uppermost level of the three second semiconductor chip groups 700, 700' and 700" may be electrically connected to the third bond finger 543 of the substrate 510 through a first interconnection. The first interconnection may be, for example, a first metal wire 921. The third bond finger 543 may correspond to a bond finger which is connected to the dummy pad 713' of the lowermost second semiconductor chip 710' of the second semiconductor chip group 700'. The output bonding pad 712" of the lower second semiconductor chip 710" may be electrically connected to the input bonding pad 721" of the upper second semiconductor chip 720". The upper second semiconductor chip 720" may be disposed on the lower second semiconductor chip 710" through a second interconnection, for example, a second metal wire 922. If the second semiconductor chip group 700" includes three or more second semiconductor chips which are sequentially stacked, the interconnection scheme to connect the output bonding pad 712" of the lower second semiconductor chip 710" to the input bonding pad 721" of the upper second semiconductor chip 720" through the second metal wire 922 may be repeatedly applied. The interconnection scheme may be applied to all of the second semiconductor chips between the lowermost second semiconductor chip and the uppermost second semiconductor chip. The output bonding pad 722" of the second semiconductor chip 720" corresponding to an uppermost semiconductor chip of the second semiconductor chip group 700" may be electrically connected to the dummy pad 713" of the second semiconductor chip 710". The second semiconductor chip 710" may be disposed under the second semiconductor chip 720" through a third interconnection, for example, a third metal wire 923. If the second semiconductor chip group 700" includes three or more second semiconductor chips which are sequentially stacked, the interconnection scheme to connect the output bonding pad 722" of the second semiconductor chip 720" to the dummy pad 713" of the second semiconductor chip 710" through the third metal wire 923 may be repeatedly applied. The interconnection scheme may be applied to all of the second semiconductor chips between the lowermost second semiconductor chip and the uppermost second semiconductor chip. The dummy pad 713" of the lowermost second semiconductor chip 710" may be electrically connected to the fourth bond finger 544 of the substrate 510 through a fourth interconnection. The fourth interconnection may be, for example, a fourth metal wire 924.

In some embodiments, if the second semiconductor chip group 700" includes three or more second semiconductor chips which are sequentially stacked, the output bonding pad of the uppermost second semiconductor chip may be electrically connected to a dummy pad through the third metal wire 923. The dummy pad may be of one of the second semiconductor chips under the uppermost second semiconductor chip. The dummy pad may be electrically connected to the fourth bond finger 544 of the substrate 510 through the fourth metal wire 924. Alternatively, if the second semiconductor chip group 700" includes three or more second semiconductor chips which are sequentially stacked, the output bonding pad of the uppermost second semiconductor chip may be electrically connected to a dummy pad through the third metal wire 923. The dummy pad may be of one of the second semiconductor chips under the uppermost second semiconductor chip. The dummy pad may be electrically connected to the fourth bond finger 544 of the substrate 510 via a dummy pad of another second semiconductor chip.

As described above, the third bond finger 543 of the substrate 510 may be connected to the fourth bond finger 544 through a third token ring loop which includes the first metal wire 921, the input bonding pad 711" and the output bonding pad 712" of the second semiconductor chip 710". The third token ring loop may include the second metal wire 922, the input bonding pad 721" and the output bonding pad 722" of the second semiconductor chip 720". The third token ring loop may include the third metal wire 923, the dummy pad 713" of the second semiconductor chip 710", and the fourth metal wire 924.

A second token ring group may consist of the first token ring loop between the substrate 510 and the second semiconductor chip group 700. The second token ring group may also consist of the second token ring loop between the substrate 510 and the second semiconductor chip group 700'. In addition, the second token ring group may consist of the third token ring loop between the substrate 510 and the second semiconductor chip group 700". The second token ring group may electrically connect the second semiconductor chip groups 700, 700' and 700" to each other.

According to the embodiments set forth above, a plurality of semiconductor chips stacked on a substrate may be serially connected by at least one token ring loop. Thus, the at least one token ring loop may reduce an amount of the current flowing through the plurality of semiconductor chips. In particular, the embodiments may also be equally applicable to stack packages having various step structures.

The embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A stack package comprising:
a substrate having a first bond finger and a second bond finger;
a plurality of semiconductor chips stacked on the substrate, each of the plurality of semiconductor chips having an input bonding pad and an output bonding pad;
a first interconnection electrically connecting the first bond finger to the input bonding pad of a lowermost semiconductor chip of the plurality of semiconductor chips;
a second interconnection electrically connecting the output bonding pad of a lower semiconductor chip of the plurality of semiconductor chips to the input bonding pad of an upper semiconductor chip stacked on the lower semiconductor chip; and
a third interconnection electrically connecting the output bonding pad of an uppermost semiconductor chip of the plurality of semiconductor chips to the second bond finger.

2. The stack package of claim 1, wherein the plurality of semiconductor chips are stacked to have a step structure to expose the input bonding pads and the output bonding pads.

3. The stack package of claim 1, wherein each of the first to third interconnections includes a metal wire.

4. The stack package of claim 1, wherein the first and second bond fingers act as an input terminal and an output terminal, respectively.

5. The stack package of claim 1, wherein the input bonding pad and the output bonding pad of each of the semiconductor chips are connected to each other through an internal circuit integrated in the corresponding semiconductor chip.

6. A stack package comprising:
a substrate having a first bond finger and a second bond finger;
a plurality of semiconductor chips stacked on the substrate, each of the plurality of semiconductor chips having an input bonding pad, an output bonding pad and a dummy pad;
a first interconnection electrically connecting the first bond finger to the input bonding pad of a lowermost semiconductor chip of the plurality of semiconductor chips;
a second interconnection electrically connecting the output bonding pad of a lower semiconductor chip of the plurality of semiconductor chips to the input bonding pad of an upper semiconductor chip stacked on the lower semiconductor chip;
a third interconnection electrically connecting the output bonding pad of an upper semiconductor chip of the plurality of semiconductor chips to the dummy pad of a lower semiconductor chip under the upper semiconductor chip; and
a fourth interconnection electrically connecting the dummy pad of a lowermost semiconductor chip of the plurality of semiconductor chips to the second bond finger.

7. The stack package of claim 6, wherein the plurality of semiconductor chips are stacked to have a step structure to expose the input bonding pads, the output bonding pads, and the dummy pads.

8. The stack package of claim 6, wherein the first and second bond fingers act as an input terminal and an output terminal, respectively.

9. The stack package of claim 6, wherein the input bonding pad and the output bonding pad of each of the semiconductor chips are connected to each other through an internal circuit integrated in the corresponding semiconductor chip.

* * * * *